(12) United States Patent
Ota et al.

(10) Patent No.: US 11,696,512 B2
(45) Date of Patent: Jul. 4, 2023

(54) MAGNETIC DOMAIN WALL MOVING ELEMENT AND MAGNETIC ARRAY

(71) Applicant: TDK CORPORATION, Tokyo (JP)

(72) Inventors: Minoru Ota, Tokyo (JP); Tatsuo Shibata, Tokyo (JP); Minoru Sanuki, Tokyo (JP)

(73) Assignee: TDK CORPORATION, Tokyo (JP)

( * ) Notice: Subject to any disclaimer, the term of this patent is extended or adjusted under 35 U.S.C. 154(b) by 255 days.

(21) Appl. No.: 17/141,347

(22) Filed: Jan. 5, 2021

(65) Prior Publication Data

US 2022/0216394 A1 Jul. 7, 2022

(51) Int. Cl.
*H10N 50/80* (2023.01)
*H01F 10/32* (2006.01)
*H10B 61/00* (2023.01)
*H10N 50/10* (2023.01)
*H10N 50/85* (2023.01)

(52) U.S. Cl.
CPC ............. *H10N 50/80* (2023.02); *H01F 10/32* (2013.01); *H10B 61/22* (2023.02); *H10N 50/10* (2023.02); *H10N 50/85* (2023.02)

(58) Field of Classification Search
None
See application file for complete search history.

(56) References Cited

U.S. PATENT DOCUMENTS

| | | | |
|---|---|---|---|
| 6,876,522 B2 | 4/2005 | Ambrose et al. | |
| 9,117,523 B1* | 8/2015 | Morris | G11C 11/1675 |
| 10,685,683 B2* | 6/2020 | Ashida | G11C 11/161 |
| 10,777,247 B1* | 9/2020 | Sun | G11C 11/1673 |
| 10,923,169 B2* | 2/2021 | Ashida | G11C 11/1675 |
| 11,017,821 B2* | 5/2021 | Ashida | G11C 11/161 |
| 11,362,269 B2* | 6/2022 | Cai | G11C 11/1675 |
| 2007/0217087 A1 | 9/2007 | Hirata et al. | |
| 2010/0149863 A1 | 6/2010 | Lee et al. | |
| 2011/0129691 A1 | 6/2011 | Ishiwata et al. | |
| 2013/0313506 A1 | 11/2013 | Murayama et al. | |
| 2015/0078070 A1 | 3/2015 | Quinsat et al. | |
| 2017/0221577 A1* | 8/2017 | Choe | G11C 19/0841 |

(Continued)

FOREIGN PATENT DOCUMENTS

| JP | 2007-250977 A | 9/2007 |
|---|---|---|
| JP | 2007-324269 A | 12/2007 |

(Continued)

OTHER PUBLICATIONS

Guchang Han et al. "Control of Offset Field and Pinning Stability in Perpendicular Magnetic Tunnelling Junctions With Synthetic Antiferromagnetic Coupling Multilayer". Journal of Applied Physics, vol. 117, 2015, pp. 17B515-1 through 17B515-4.

(Continued)

*Primary Examiner* — Kevin M Bernatz
(74) *Attorney, Agent, or Firm* — Oliff PLC

(57) ABSTRACT

A magnetic domain wall moving element according to an embodiment includes: a magnetic recording layer, a ferromagnetic layer, and a non-magnetic layer arranged between the magnetic recording layer and the ferromagnetic layer, wherein the ferromagnetic layer contains an additive element dispersed therein, and the additive element is one or more of H, He, Ne, Ar, Kr, Xe, N, C, Ag, Cu, Hg, Au, Pb, Zn, and Bi.

9 Claims, 9 Drawing Sheets

(56) References Cited

U.S. PATENT DOCUMENTS

| | | | |
|---|---|---|---|
| 2017/0287978 A1* | 10/2017 | Toh | H01L 21/02636 |
| 2018/0130511 A1* | 5/2018 | Belashchenko | H10N 50/10 |
| 2018/0277683 A1* | 9/2018 | Han | H01L 29/40111 |
| 2018/0301621 A1* | 10/2018 | Sato | H01F 10/329 |
| 2019/0019942 A1 | 1/2019 | Nakada et al. | |
| 2019/0074430 A1 | 3/2019 | Shiokawa et al. | |
| 2019/0088395 A1 | 3/2019 | Ota et al. | |
| 2019/0189172 A1 | 6/2019 | Higo et al. | |
| 2019/0355898 A1 | 11/2019 | Nakada | |
| 2021/0232903 A1* | 7/2021 | Friedman | G11C 11/1675 |
| 2021/0376229 A1* | 12/2021 | Ashida | G11C 11/161 |
| 2021/0383853 A1* | 12/2021 | Shibata | H10B 61/22 |

FOREIGN PATENT DOCUMENTS

| | | |
|---|---|---|
| JP | 2010-141340 A | 6/2010 |
| JP | 2012190914 A | 10/2012 |
| JP | 2013-247198 A | 12/2013 |
| JP | 5441005 B2 | 3/2014 |
| JP | 2015-060609 A | 3/2015 |
| JP | 2017-097935 A | 6/2017 |
| JP | 6204769 B2 | 9/2017 |
| JP | 2019-021751 A | 2/2019 |
| JP | 2019-046976 A | 3/2019 |
| JP | 2019-047120 A | 3/2019 |
| JP | 2019-201095 A | 11/2019 |
| WO | 2017208653 A1 | 12/2017 |

OTHER PUBLICATIONS

U.S. Appl. No. 17/124,643, filed Dec. 17, 2020.

Goripati et al., Bi-quadratic interlayer exchange coupling in Co2MnSi/Ag/Co2MnSi pseudo spin-valve, Journal of Applied Physics 110, 123914 (2011).

Furubayashi et al., Structure and transport properties of current-perpendicular-to-plane spin valves using Co2FeAl0.5Si0.5 and Co2MnSi Heusler alloy electrodes, Journal of Applied Physics 107, 113917 2010.

Kasai et al., Large magnetoresistance in Heusler-alloy-based epitaxial magnetic junctions with semiconducting Cu (In0.8Ga0.2)Se2 spacer, Applied Physics Letters 109, 032409 (2016).

Wen et al., Fully epitaxial C1b-type NiMnSb half-Heusler alloy films for current-perpendicular-to-plane giant magnetoresistance devices with a Ag spacer, scientific reports, 5:18387, DOI: 10.1038/srep18387, 2015.

Galanakis et al., Electronic structure and Slater-Pauling behaviour in half-metallic Heusler alloys calculated from first principles, J. Phys. D: Appl. Phys. 39 (2006) 765-115.

Kwon et al., Anisotropic magnetoresistance and current-perpendicular-to-plane giant magnetoresistance in epitaxial NiMnSb-based multilayers, Journal of Applied Physics 119, 023902 (2016).

Choi et al., Enhancement of current-perpendicular-to-plane giant magnetoresistance by insertion of amorphous ferromagnetic underlayer in Heusler alloy-based spin-valve structures, Applied Physics Express 10, 013006 (2017).

Mar. 16, 2021 International Search Report issued in PCT/JP2020/047677.

* cited by examiner

MAGNETIC DOMAIN WALL MOVING ELEMENT AND MAGNETIC ARRAY

BACKGROUND

Field

The present invention relates to a magnetic domain wall moving element and a magnetic array.

Description of Related Art

Attention is focused on next-generation non-volatile memories which will replace flash memories and the like in which sizes thereof have reached the limit thereof. For example, magnetoresistive random access memories (MRAMs), resistance random access memories (ReRAMs), phase change random access memories (PCRAM), and the like are known as next-generation non-volatile memories.

MRAMs utilize a change in resistance value caused due to a change in direction of magnetization for data recording. Data recording is carried out using each of magnetoresistance change elements constituting MRAMs. For example, Japanese Patent No. 5441005 describes a magnetoresistance change element (a magnetic domain wall moving element) in which multi-valued data can be recorded by moving a domain wall in a magnetic recording layer.

DETAILED DESCRIPTION OF THE INVENTION

Figure 1:
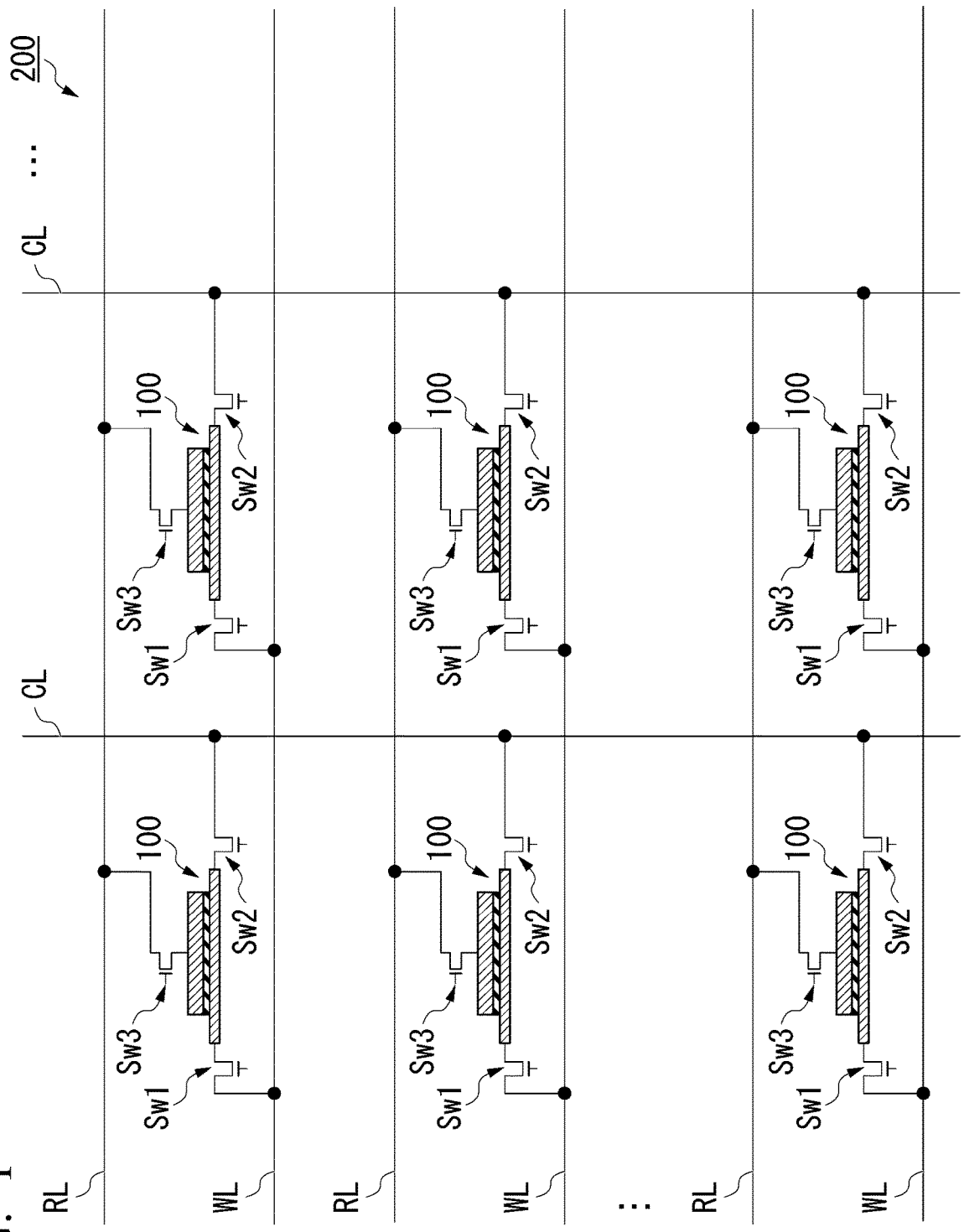
FIG. 1 is a constitution diagram of a magnetic array according to a first embodiment.

An embodiment will be described in detail below with reference to the drawings as appropriate. In the drawings used in the following description, enlarged characteristic parts may be illustrated for the sake of easily understanding the features of the present invention for convenience in some cases and the dimensional ratios of the constituent elements may differ from those of the actual constituent elements in some cases. The materials, the dimensions, and the like exemplified in the following description are examples, the present invention is not limited thereto, and it is possible to carry out modifications as appropriate within a range in which the effects of the present invention are exhibited.

A magnetic domain wall moving element according to the embodiment includes a magnetic recording layer, a ferromagnetic layer, and a non-magnetic layer arranged between the magnetic recording layer and the ferromagnetic layer, the ferromagnetic layer contains an additive element dispersed therein, and the additive element is any one or more of H, He, Ne, Ar, Kr, Xe, N, C, Ag, Cu, Hg, Au, Pb, Zn, and Bi. In the magnetic domain wall moving element according to the embodiment, an additive element exhibiting diamagnetism minimizes a leakage magnetic field from the ferromagnetic layer.

First, directions are defined. An x direction and a y direction are directions which are substantially parallel to one surface of a substrate Sub (refer to FIG. 2) which will be described later. The x direction is a direction in which a magnetic recording layer 10 which will be described later extends. The y direction is a direction which is orthogonal to the x direction. A z direction is a direction from the substrate Sub which will be described later toward magnetic domain wall moving elements 100, and for example, is a direction in which the magnetic recording layer 10 is laminated. Hereinafter, a +z direction may be expressed as the term "up or upward" and a −z direction may be expressed as the term "down or downward" in some cases. The terms "up, upward, down, and downward" do not necessarily coincide with a direction in which a gravitational force is applied. Furthermore, in this specification, "extending in the x direction" means that, for example, the dimension in the x direction is larger than the smallest dimension among the dimensions in the x direction, the y direction, and the z direction. The same applies to the case of extending in the other directions.

First Embodiment

FIG. 1 is a constitution diagram of a magnetic array according to a first embodiment. A magnetic array 200 includes a plurality of magnetic domain wall moving elements 100, a plurality of write lines WL, a plurality of common lines CL, a plurality of read lines RL, a plurality of first switching elements Sw1, a plurality of second switching elements Sw2, and a plurality of third switching elements Sw3. The magnetic array 200 can be used, for example, in a magnetic memory, a product-sum calculator, and a neuromorphic device.

Each of the write lines WL electrically connects a power supply to one or more of the magnetic domain wall moving elements 100. The power supply is connected to the magnetic array 200 at the time of use. The power supply is connected to one end of each of the write lines WL.

The common lines CL are lines which can be used both when data is written and when data is read. Each of the common lines CL electrically connects a reference potential to one or more of the magnetic domain wall moving elements 100. The reference potential is, for example, a ground. Each of the common lines CL may be provided in each of the plurality of magnetic domain wall moving elements 100 or may be provided over the plurality of magnetic domain wall moving elements 100.

Each of the read lines RL electrically connects the power supply to one or more of the magnetic domain wall moving elements 100. The power supply is connected to the magnetic array 200 at the time of use. The power supply is connected to one end of each of the write lines WL.

Each of the first switching elements Sw1, each of the second switching elements Sw2, and each of the third switching elements Sw3 illustrated in FIG. 1 are connected to one of the plurality of magnetic domain wall moving elements 100. The first switching element Sw1 is connected between each of the magnetic domain wall moving elements 100 and the write line WL. The second switching element Sw2 is connected between each of the magnetic domain wall moving elements 100 and the common line CL. The third switching element Sw3 is connected between each of the magnetic domain wall moving elements 100 and the read line RL.

If the first switching element Sw1 and the second switching element Sw2 are turned on, a write current flows between a prescribed write line WL and common line CL connected to the magnetic domain wall moving element 100. If the second switching element Sw2 and the third switching element Sw3 are turned on, a read current flows between a prescribed common line CL and read line RL connected to the magnetic domain wall moving elements 100.

The first switching elements Sw1, the second switching elements Sw2, and the third switching elements Sw3 are elements configured to control a flow of an electric current. The first switching elements Sw1, the second switching elements Sw2, and the third switching elements Sw3 may be, for example, transistors, elements in which a phase change of a crystal layer is utilized such as ovonic threshold switches (OTSs), elements in which a change in band structure is utilized such as metal-insulator transition (MIT) switches, elements in which a breakdown voltage is utilized such as Zener diodes and avalanche diodes, and elements whose conductivity changes along with a change in atomic position.

Any one of the first switching elements Sw1, the second switching elements Sw2, and the third switching elements Sw3 may be shared by the magnetic domain wall moving elements 100 connected to the same line. For example, when each of the first switching elements Sw1 is shared, one of the first switching elements Sw1 is provided upstream of each of the write lines WL. For example, when each of the second switching elements Sw2 is shared, one of the second switching elements Sw2 is provided upstream of each of the common lines CL. For example, when each of the third switching elements Sw3 is shared, one of the third switching elements Sw3 is provided upstream of each of the read lines RL.

Figure 2:
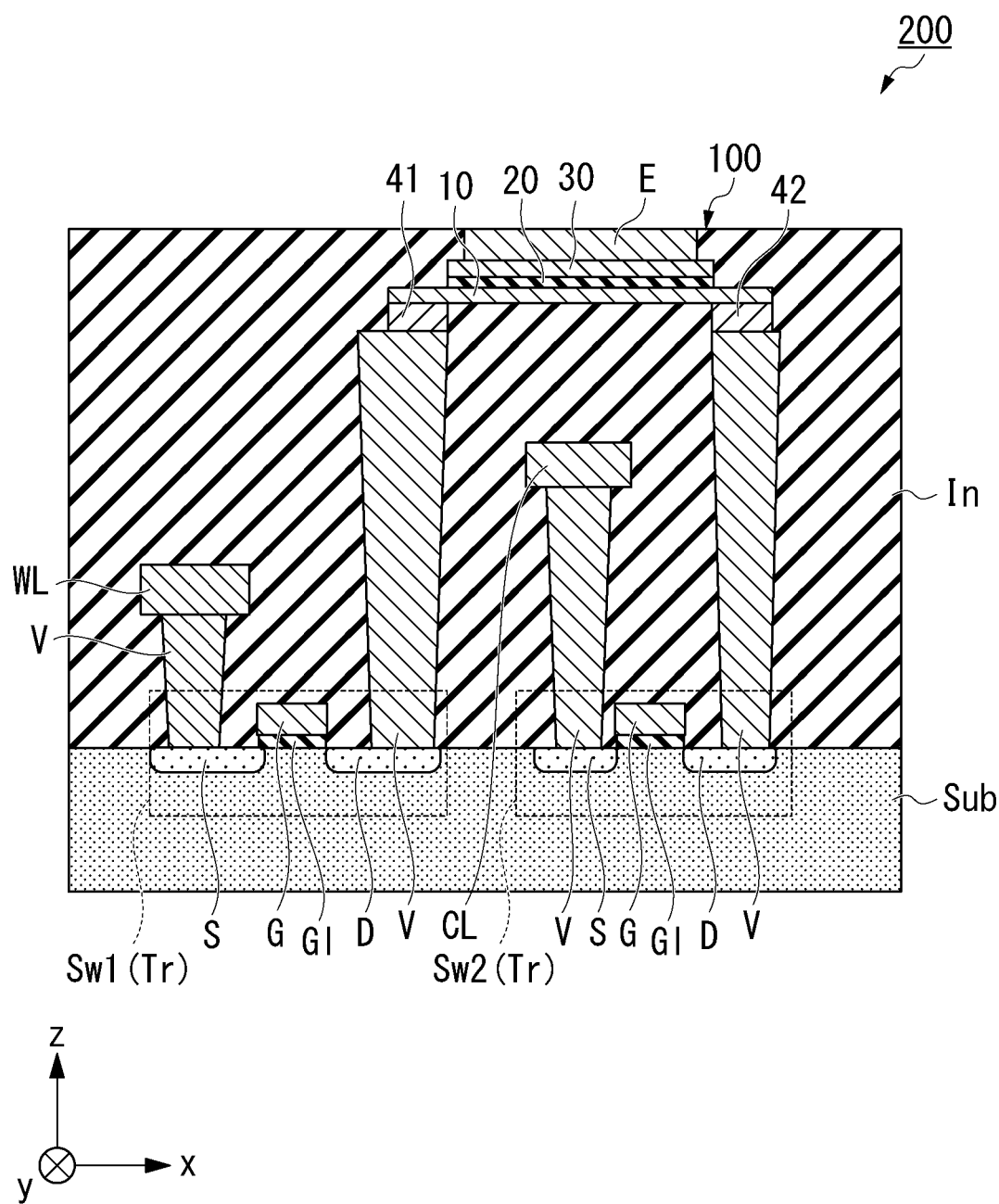
FIG. 2 is a cross-sectional view of a characteristic part of the magnetic array according to the first embodiment.

FIG. 2 is a cross-sectional view of a characteristic part of the magnetic array 200 according to the first embodiment. FIG. 2 is a cross section of one of the magnetic domain wall moving elements 100 in FIG. 1 taken along an xz plane passing through a center of a width of the magnetic recording layer 10 in the y direction.

The first switching elements Sw1 and the second switching elements Sw2 illustrated in FIG. 2 are transistors Tr. Each of the transistors Tr includes a gate electrode G, a gate insulating film GI, and a source region S and a drain region D formed on the substrate Sub. The substrate Sub is, for example, a semiconductor substrate. Each of the third switching elements Sw3 is electrically connected to an electrode E and is located, for example, at a different position in the y direction.

Each of the transistors Tr and each of the magnetic domain wall moving elements 100 are electrically connected to each other via a via line V. The via line V contains a material with conductivity. For example, the via line V extends in the z direction. For example, the via line V is formed, for example, in an opening portion of an insulating layer In.

The magnetic domain wall moving elements 100 are electrically isolated from the transistors Tr using the insulating layer In except for the via line V. The insulating layer In is an insulating layer configured to insulate between lines of a multilayer line and between elements. Examples of the insulating layer In include silicon oxides ($SiO_x$), silicon nitrides ($SiN_x$), silicon carbide (SiC), chromium nitride, silicon carbonitride (SiCN), silicon oxynitride (SiON), aluminum oxide ($Al_2O_3$), zirconium oxides ($ZrO_x$), and the like.

Figure 3:
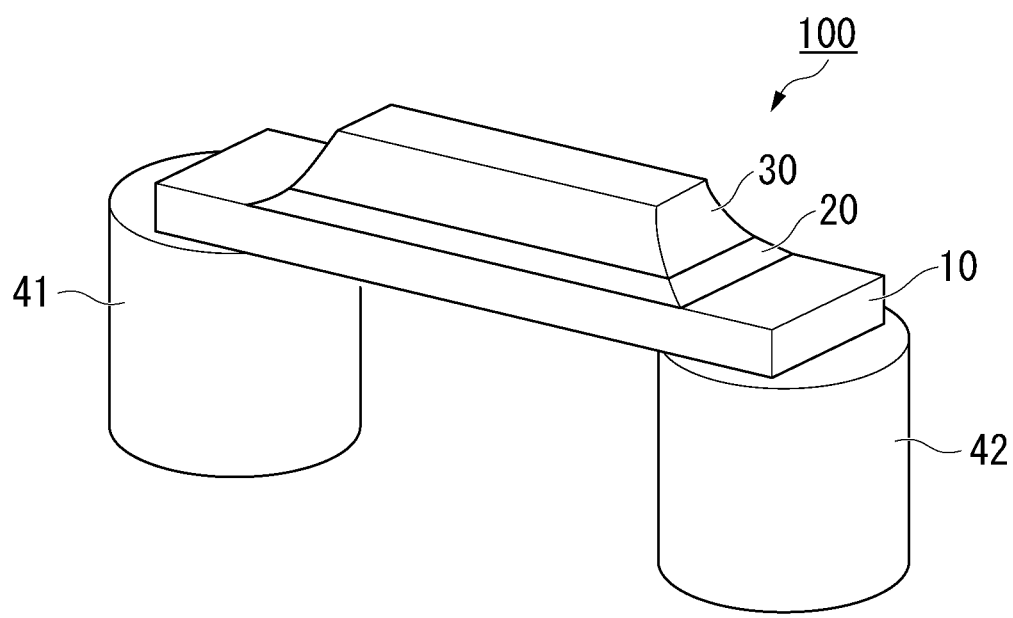
FIG. 3 is a perspective view of a magnetic domain wall moving element according to the first embodiment.
Figure 3:
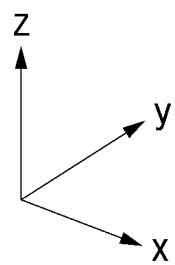
Figure 4:
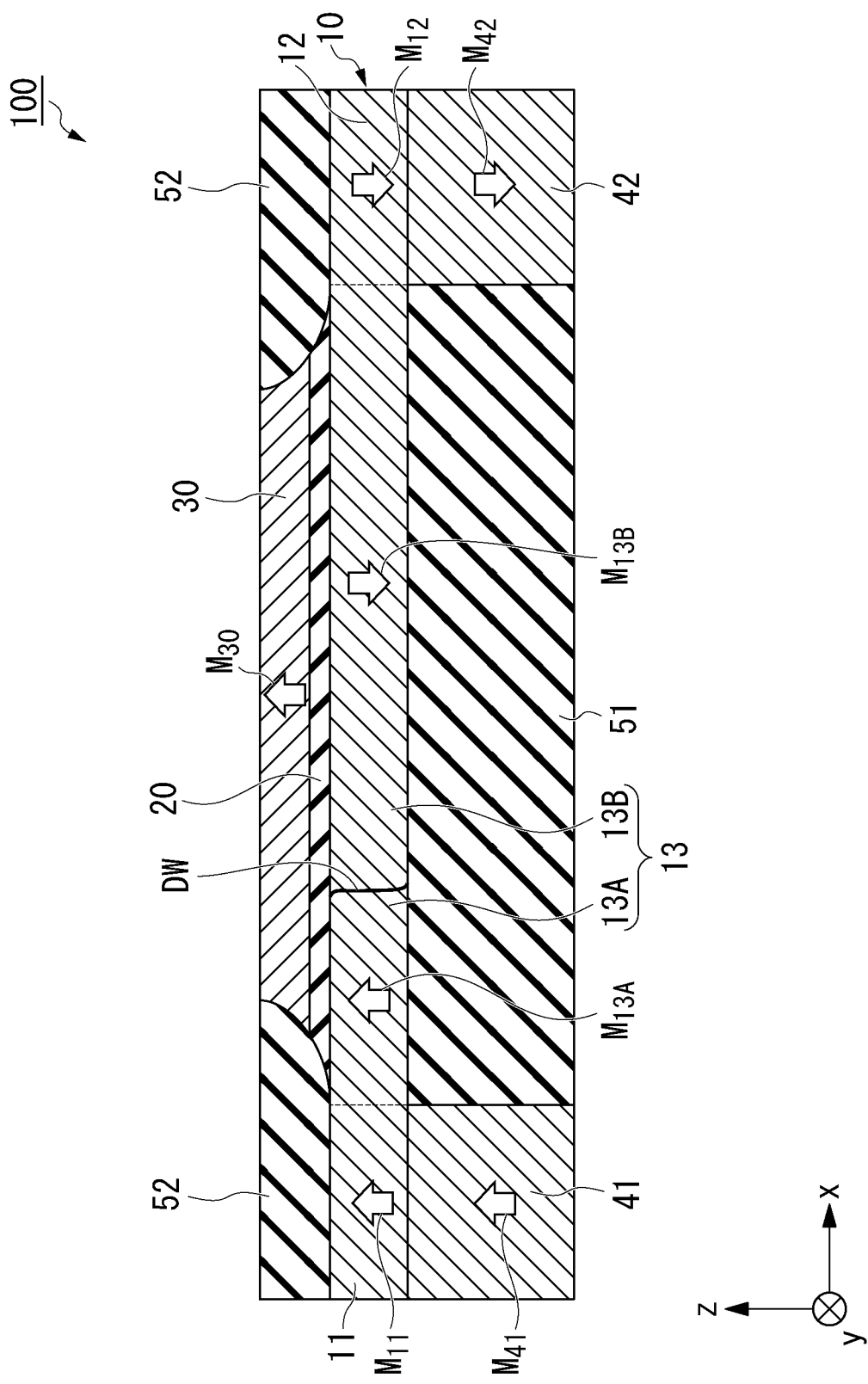
FIG. 4 is a cross-sectional view of the magnetic domain wall moving element according to the first embodiment.

FIG. 3 is a perspective view of the magnetic domain wall moving element 100. FIG. 4 is a cross-sectional view of the magnetic domain wall moving element 100 taken along the xz plane passing through the center of the magnetic recording layer 10 in the y direction.

The magnetic domain wall moving element 100 includes, for example, the magnetic recording layer 10, a non-magnetic layer 20, a ferromagnetic layer 30, a first conductive layer 41, and a second conductive layer 42. The periphery of the magnetic domain wall moving element 100 is covered with an insulating layer 51 and an insulating layer 52. When data is written to the magnetic domain wall moving element 100, a write current flows through the magnetic recording layer 10 between the first conductive layer 41 and the second conductive layer 42. When data is read from the magnetic domain wall moving element 100, a read current flows between the first conductive layer 41 or the second conductive layer 42 and the ferromagnetic layer 30.

The magnetic recording layer 10 is a part which extends in the x direction and to which a write current is to be applied. The magnetic recording layer 10 has, for example, a rectangular shape in which the x direction is a long axis and the y direction is a short axis when viewed in a plan view from the z direction. The magnetic recording layer 10 is connected to the first conductive layer 41 and the second conductive layer 42. A write current flows along the magnetic recording layer 10 from the first conductive layer 41 toward the second conductive layer 42 or from the second conductive layer 42 toward the first conductive layer 41.

The magnetic recording layer 10 is a layer in which information can be magnetically recorded using a change in internal magnetic state. The magnetic recording layer 10 may be referred to as a "ferromagnetic layer or a domain wall moving layer" in some cases.

The magnetic recording layer 10 includes, for example, magnetization fixing regions 11 and 12 and a domain wall moving region 13. The domain wall moving region 13 is arranged between two regions which are the magnetization fixing regions 11 and 12.

The magnetization fixing region 11 is a region of the magnetic recording layer 10 that overlaps the first conductive layer 41 when viewed from the z direction. The magnetization fixing region 12 is a region of the magnetic recording layer 10 that overlaps the second conductive layer 42 when viewed from the z direction. Magnetizations $M_{11}$ and $M_{12}$ of the magnetization fixing regions 11 and 12 are not easily reversed as compared with magnetizations $M_{13A}$ and $M_{13B}$ of the domain wall moving region 13 and magnetization reversal is not performed even if an external force of a threshold value in which the magnetizations $M_{13A}$ and $M_{13B}$ of the domain wall moving region 13 are reversed is applied. For this reason, it can be said that the magnetizations $M_{11}$ and $M_{12}$ of the magnetization fixing regions 11 and 12 are fixed to the magnetizations $M_{13A}$ and $M_{13B}$ of the domain wall moving region 13. That is to say, in this specification, the expression "magnetization is fixed" means that a magnetization is not reversed even if a write current of a reverse current density in which the magnetization of the domain wall moving region 13 is reversed is applied.

The magnetization $M_{11}$ of the magnetization fixing region 11 and the magnetization $M_{12}$ of the magnetization fixing region 12 are oriented in different directions. The magnetization $M_{11}$ of the magnetization fixing region 11 and the magnetization $M_{12}$ of the magnetization fixing region 12 are oriented, for example, in opposite directions. The magnetization $M_{11}$ of the magnetization fixing region 11 is oriented, for example, in the +z direction and the magnetization $M_{12}$ of the magnetization fixing region 12 is oriented, for example, in the −z direction.

The domain wall moving region 13 has a first magnetic domain 13A and a second magnetic domain 13B. The first magnetic domain 13A is adjacent to the magnetization fixing region 11. A magnetization $M_{13A}$ of the first magnetic domain 13A has an influence on the magnetization $M_{11}$ of the magnetization fixing region 11 and is oriented, for example, in the same direction as the magnetization $M_{11}$ of the magnetization fixing region 11. The second magnetic domain 13B is adjacent to the magnetization fixing region 12. A magnetization $M_{13B}$ of the second magnetic domain 13B has an influence on the magnetization $M_{12}$ of the magnetization fixing region 12 and is oriented, for example, in the same direction as the magnetization $M_{12}$ of the magnetization fixing region 12. For this reason, the magnetization $M_{13A}$ of the first magnetic domain 13A and the magnetization $M_{13B}$ of the second magnetic domain 13B are oriented in different directions. The magnetization $M_{13A}$ of the first magnetic domain 13A and the magnetization $M_{13B}$ of the second magnetic domain 13B are oriented, for example, in opposite directions.

A boundary between the first magnetic domain 13A and the second magnetic domain 13B is a domain wall DW. The domain wall DW moves in the domain wall moving region 13. In principle, the domain wall DW does not enter the magnetization fixing regions 11 and 12 except when an external force equal to or more than expected is applied.

If a ratio between the first magnetic domain 13A and the second magnetic domain 13B in the domain wall moving region 13 changes, the domain wall DW moves. The domain wall DW moves by causing a write current to flow in the x direction of the domain wall moving region 13. For example, if a write current (for example, a current pulse) in a write current in the +x direction (for example, a current pulse) is applied to the domain wall moving region 13, electrons flow in the −x direction opposite to the current. Thus, the domain wall DW moves in the −x direction. When an electric current flows from the first magnetic domain 13A toward the second magnetic domain 13B, spin-polarized electrons in the second magnetic domain 13B reverse the magnetization $M_{13A}$ of the first magnetic domain 13A. When the magnetization $M_{13A}$ of the first magnetic domain 13A is reversed, the domain wall DW moves in the −x direction.

The magnetic recording layer 10 is mainly composed of a magnetic material. The magnetic recording layer 10 preferably has at least one element selected from the group consisting of Fe, Co, Ni, Pt, Pd, Gd, Tb, Mn, Ge, and Ga and preferably contains at least one of Fe, Co, and Ni.

Examples of the material used for the magnetic recording layer 10 include laminated films of CoFe and Pt, laminated films of CoFe and Pd, laminated films of Co and Ni, laminated films of Co and Pt, laminated films of Co and Pd, MnGa-based materials, GdCo-based materials, and TbCo-based materials. Ferrimagnetic materials such as MnGa-based materials, GdCo-based materials, and TbCo-based materials have a small saturation magnetization and a small threshold current required for moving the domain wall DW. Furthermore, the laminated films of CoFe and Pt, the laminated films of CoFe and Pd, the laminated films of Co and Ni, the laminated films of Co and Pt, and the laminated films of Co and Pd have a large coercive force and a moving speed of the domain wall DW is reduced. In addition, the material used for the magnetic recording layer 10 may be CoFeB, FeB, CoB, or the like. If such materials are used for the magnetic recording layer 10, a ratio between changes in magnetic resistance (an MR ratio) of the magnetic domain wall moving elements 100 increases.

The ferromagnetic layer 30 is located, for example, on the non-magnetic layer 20. The ferromagnetic layer 30 has a magnetization $M_{30}$ oriented in one direction. The magnetization $M_{30}$ of the ferromagnetic layer 30 is less like to be reversed as compared with the magnetizations $M_{13A}$ and $M_{13B}$ of the domain wall moving region 13 when a prescribed external force is applied to the ferromagnetic layer 30. The prescribed external force is, for example, an external force applied to the magnetization due to an external magnetic field or an external force applied to the magnetization due to a spin polarization current. The ferromagnetic layer 30 may be referred to as a "magnetization fixed layer" or a "magnetization reference layer" in some cases.

A resistance value of the magnetic domain wall moving elements 100 in a direction in which the magnetic domain wall moving elements 100 are laminated changes in accordance with a difference between relative angles of the magnetization $M_{30}$ of the ferromagnetic layer 30 and the magnetizations $M_{13A}$ and $M_{13B}$ of the domain wall moving region 13. The magnetization $M_{13A}$ of the first magnetic domain 13A is oriented, for example, to the same direction as (to be parallel to) the magnetization $M_{30}$ of the ferromagnetic layer 30 and the magnetization $M_{13B}$ of the second magnetic domain 13B is oriented, for example, to an opposite direction (to be antiparallel) to the magnetization $M_{30}$ of the ferromagnetic layer 30. If an area of the first magnetic domain 13A in a portion in which the first magnetic domain 13A and the ferromagnetic layer 30 overlap when viewed in a plan view from the z direction increases, a resistance value of the magnetic domain wall moving elements 100 decreases. On the other hand, if an area of the second magnetic domain 13B in a portion in which the second magnetic domain 13B and the ferromagnetic layer 30 overlap when viewed in a plan view from the z direction increases, a resistance value of the magnetic domain wall moving elements 100 increases.

The ferromagnetic layer 30 contains a ferromagnetic material. The ferromagnetic layer 30, for example, contains a metal selected from the group consisting of Cr, Mn, Co, Fe, and Ni, an alloy containing at least one of these metals, an alloy containing these metals and at least one or more elements of B, C, and N, and the like. The ferromagnetic layer 30 contains, for example, any element of Co, Fe, and Ni. The ferromagnetic layer 30, for example, contains Co—Fe, Co—Fe—B, or Ni—Fe.

The ferromagnetic layer 30 may be, for example, a Heusler alloy. A Heusler alloy is a half metal and has a high spin polarization. A Heusler alloy contains an intermetallic compound having a chemical composition of XYZ or $X_2YZ$, where X represents a Co-, Fe-, or Ni-, Cu-group transition metal element or noble metal element in the periodic table, Y represents a Mn-, V-, Cr-, or Ti-group transition metal or an element of the type X in the periodic table, and Z represents a typical element from Group III to Group V.

Examples of the Heusler alloy include $Co_2FeSi$, $Co_2FeGe$, $Co_2FeGa$, $Co_2MnSi$, $Co_2Mn_{1-a}Fe_aAl_bSi_{1-b}$, $Co_2FeGe_{1-c}Ga_c$, and the like.

The ferromagnetic layer 30 contains an additive element. The additive element is any one or more of H, He, Ne, Ar, Kr, Xe, N, C, Ag, Cu, Hg, Au, Pb, Zn, and Bi. These additive elements have a negative magnetic susceptibility and exhibit diamagnetism. Diamagnetism is a phenomenon in which, when a magnetic field is applied, magnetization in an opposite direction to that of the magnetic field occurs. The additive element does not have spontaneous magnetization and exhibits diamagnetic properties only when a magnetic field is applied.

These additive elements do not easily combine with magnetic elements and readily exhibit diamagnetic performance as a single element. Furthermore, among these additive elements, He, Ne, Ar, Kr, and Xe do not have unpaired electrons and readily exhibit diamagnetism even with the element alone. If a substance has unpaired electrons, the unpaired electrons may develop paramagnetism and the effect of diamagnetism may not be easily obtained in some cases.

Also, among these additive elements, C, Ag, Hg, Au, Pb, Zn, and Bi have a large absolute value of diamagnetic susceptibility in the state of closed shell ions and exhibit strong diamagnetism. Furthermore, among these additive elements, Ag, Cu, Au, Zn, Bi, and C are known to exhibit strong diamagnetism even at room temperature.

Also, among these additive elements, H, N, and C have a small atomic radius, enter a crystal lattice of the ferromagnetic layer 30, and form an intrusive solid solution. H, N, and C enter in the state of closed shell ions and easily develop diamagnetism.

Furthermore, among these additive elements, He, Ne, Ar, Kr, and Xe are rare gases and the outermost shell electrons have a closed shell structure and thus easily exhibit diamagnetism. In addition, rare gases are inert and substantially do not allow chemical reactions. Therefore, He, Ne, Ar, Kr, and Xe enter the ferromagnetic layer 30 in a stable state.

Also, among these additive elements, Bi, Cu, Pb, Hg, Ag, Au, and Zn and a ferromagnetic material of the ferromagnetic layer 30 are converted into alloys, exist in the state of closed shell ions, and easily exhibit diamagnetism.

The additive elements are dispersed in the ferromagnetic layer 30. The additive elements are dispersed, for example, over the entire in-plane direction of the ferromagnetic layer 30. The additive elements are also confirmed, for example, in a region 20% or more inside a width of the ferromagnetic layer 30 from an outer surface of the ferromagnetic layer 30. The details of the additive elements dispersed in the ferromagnetic layer 30 can be confirmed using energy dispersive X-ray analysis (EDS).

Content concentrations of the additive elements in the ferromagnetic layer 30 are, for example, preferably 0.14 atm % or more, and more preferably 0.35 atm % or more. Furthermore, the content concentrations of the additive elements in the ferromagnetic layer 30 are, for example, preferably 20 atm % or less, and more preferably 15 atm % or less. Each of the content concentrations of the additive elements are an average content concentration in the ferromagnetic layer 30. The average content concentration is an average value of the concentrations of the additive element at 10 different points of the ferromagnetic layer 30 measured using an EDS. When a sufficient amount of additive elements is contained, the diamagnetism produced by the additive elements can sufficiently minimize a leakage magnetic field occurring from the ferromagnetic layer 30. Furthermore, when the additive element is a prescribed value or less, it is possible to prevent a decrease in ferromagnetic characteristics inherent in the ferromagnetic layer 30.

Figure 5:
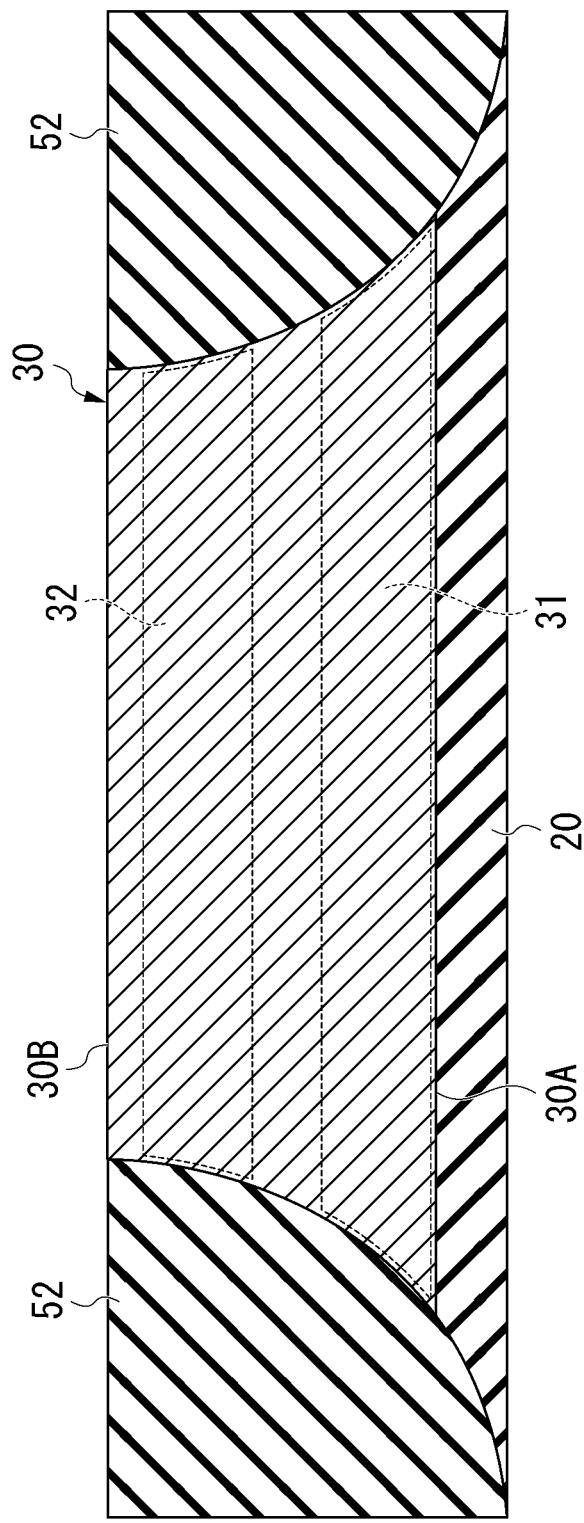
FIG. 5 is an enlarged cross-sectional view of the vicinity of a ferromagnetic layer of the magnetic domain wall moving element according to the first embodiment.

FIG. 5 is an enlarged cross-sectional view of the vicinity of the ferromagnetic layer 30 of the magnetic domain wall moving element 100 according to the first embodiment. As illustrated in FIG. 5, the ferromagnetic layer 30 may have a first region 31 and a second region 32 therein. The first region 31 and the second region 32 are regions which extend in the in-plane direction and regions obtained by dividing the ferromagnetic layer 30 in the z direction. The second region 32 is located farther from the non-magnetic layer 20 than the first region 31. The content concentrations of the additive elements in the first region 31 and the second region 32 differ.

The first region 31 has higher content concentrations of the additive elements than that of the second region 32. The content concentrations of the additive elements of the first region 31 and the second region 32 are measured through the following procedure. First, the content concentrations of the additive elements at two points at different positions in the z direction are measured at each of five different locations in the x direction. Hereinafter, of the two points at different positions in the z directions, a point near the non-magnetic layer 20 is referred to as a "first point" and a point located farther from the non-magnetic layer 20 than the first point is referred to as a "second point". Furthermore, when the content concentrations of the additive elements measured at the first point are higher than the content concentrations of the additive elements measured at the second point in each of the five locations, it is assumed that the content concentrations of the additive elements of the first region 31 are higher than the content concentrations of the additive elements of the second region 32.

The content concentrations of the additive elements in the first region 31 are, for example, preferably 1.1 times or more, and more preferably 1.4 times or more the content concentrations of the additive elements in the second region 32.

A leakage magnetic field from the ferromagnetic layer 30 occurs from a first surface 30A on the non-magnetic layer 20 side. If the content concentrations of the additive elements exhibiting diamagnetism are high near the first surface 30A, it is possible to more efficiently minimize the leakage magnetic field from the ferromagnetic layer 30.

On the other hand, the first region 31 may have, for example, lower content concentrations of the additive elements than those of the second region 32. When the content concentrations of the additive elements measured at the first point are lower than the content concentrations of the additive elements measured at the second point in each of the five different locations in the x direction, it is assumed that the content concentrations of the additive elements of the first region 31 are lower than the content concentrations of the additive elements of the second region 32.

The content concentrations of the additive elements in the second region 32 are, for example, preferably 1.1 times or more, and more preferably 1.4 times or more the content concentrations of the additive elements in the first region 31.

A change in magnetic resistance (an MR ratio) of the magnetic domain wall moving element 100 changes in accordance with a relative angle between magnetizations of two ferromagnetic materials having the non-magnetic layer 20 arranged therebetween. For this reason, a state of magnetization in the vicinity of the first surface 30A has an influence of the MR ratio of the magnetic domain wall moving element 100. Each of the additive elements is one of the causes of disturbing the orientation of the magnetization. In addition, when the content concentrations of the additive elements in the vicinity of the first surface 30A are low, it is possible to minimize a decrease in the MR ratio of the magnetic domain wall moving element 100.

Figure 6:
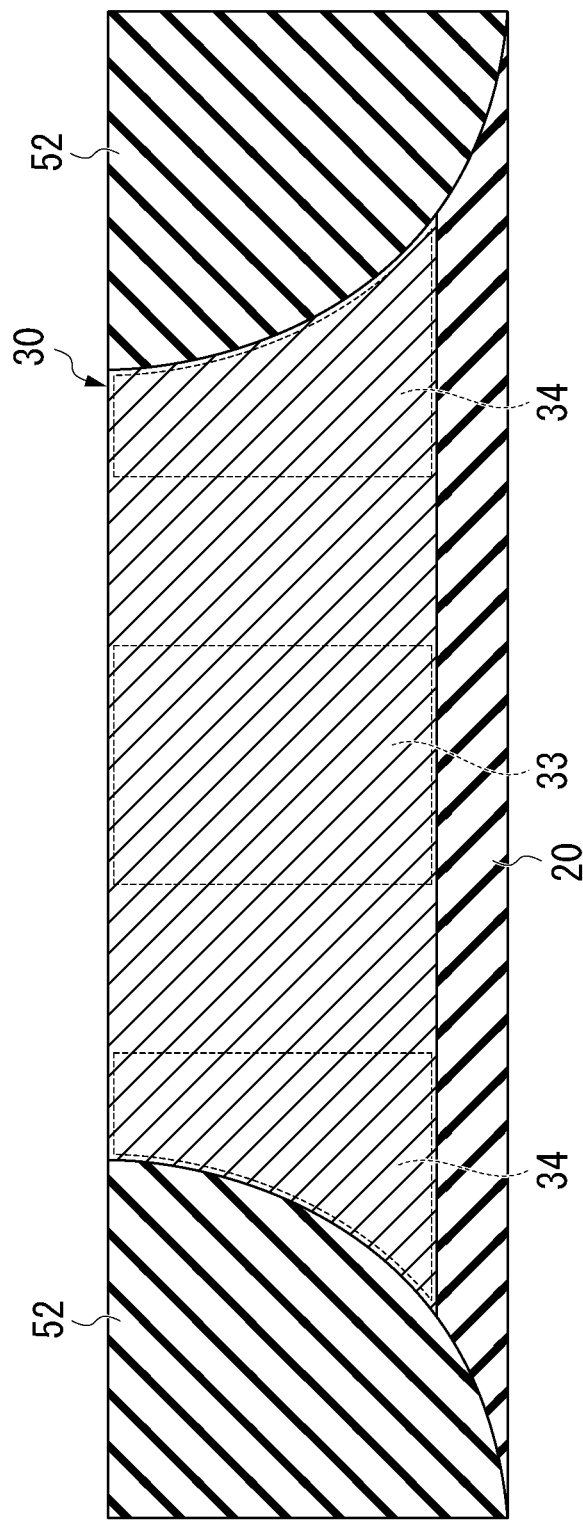
FIG. 6 is an enlarged cross-sectional view of the vicinity of a ferromagnetic layer of another example of the magnetic domain wall moving element according to the first embodiment.
Figure 6:
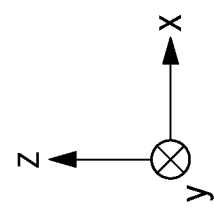

Also, FIG. 6 is an enlarged cross-sectional view of the vicinity of the ferromagnetic layer 30 of another example of the magnetic domain wall moving element 100 according to the first embodiment. As illustrated in FIG. 6, the ferromagnetic layer 30 may have a central region 33 and an outer circumferential region 34 therein. The central region 33 is a region near a center of the ferromagnetic layer 30 in the xy plane. The outer circumferential region 34 is located on an outer side of the central region 33. If the central region 33 and the outer circumferential region 34 are at the same height position, the central region 33 and the outer circumferential region 34 do not need to exist over the entire z direction.

The outer circumferential region 34 has, for example, higher the content concentrations of the additive elements than those of the central region 33. The content concentrations of the additive elements between the outer circumferential region 34 and the central region 33 are compared at the same height position in the z direction. When five different points in the x direction are measured and the content concentrations of the additive elements measured at measurement points on the outer side of the ferromagnetic layer 30 are higher than the content concentrations of the additive elements measured at measurement points on the inner side thereof, it is assumed that the content concentrations of the additive elements of the outer circumferential region 34 are higher than the content concentrations of the additive elements of the central region 33.

The content concentrations of the additive elements in the outer circumferential region 34 are, for example, preferably 1.1 times or more, and more preferably 1.4 times or more the content concentrations of the additive elements in the central region 33.

The leakage magnetic field from the ferromagnetic layer 30 strongly occurs in the vicinity of an outer circumference of the ferromagnetic layer 30. If the content concentrations of the additive elements in the outer circumferential region 34 having a large amount of leakage magnetic field to occur increase, it is possible to more efficiently minimize the leakage magnetic field from the ferromagnetic layer 30.

Also, the ferromagnetic layer 30 may share the first region 31 and the second region 32 with the central region 33 and the outer circumferential region 34. For example, the leakage magnetic field from the ferromagnetic layer 30 particularly occurs in the vicinity of an outer circumference of the first surface 30A of the ferromagnetic layer 30. For this reason, the content concentrations of the additive elements in the vicinity of the outer circumference of the first surface 30A may be higher than the content concentrations of the additive elements in the other parts.

A film thickness of the ferromagnetic layer 30 is preferably 1.5 nm or less, and more preferably 1.0 nm or less when an easy axis of magnetization of the ferromagnetic layer 30 is assumed to be directed in the z direction (the ferromagnetic layer is formed as a perpendicular magnetization film). If a thin film thickness of the ferromagnetic layer 30 is provided, at an interface between the ferromagnetic layer 30 and another layer (the non-magnetic layer 20), perpendicular magnetic anisotropy (interfacial perpendicular magnetic anisotropy) is added to the ferromagnetic layer 30 and the magnetization of the ferromagnetic layer 30 is easily oriented in the z direction.

When the easy axis of magnetization of the ferromagnetic layer 30 is assumed to be directed in the z direction (the ferromagnetic layer 30 is formed as a perpendicular magnetization film), it is desirable that the ferromagnetic layer 30 be a laminate of a ferromagnetic material selected from the group consisting of Co, Fe, and Ni and a non-magnetic material selected from the group consisting of Pt, Pd, Ru, and Rh and an intermediate layer made of a material selected from the group consisting of W, Mo, Ta, Ru, Ti, Cr, MgO, MgAlO, AlO, Mg, and Ir may be provided at any position on the laminate. If the intermediate layer is provided in the ferromagnetic material, it is possible to add interfacial perpendicular magnetic anisotropy and the magnetization of the ferromagnetic layer 30 is easily oriented in the z direction.

"Non-Magnetic Layer"

The non-magnetic layer 20 is arranged between the magnetic recording layer 10 and the ferromagnetic layer 30. The non-magnetic layer 20 is laminated, for example, on one surface of the magnetic recording layer 10.

The non-magnetic layer 20 is made of, for example, a non-magnetic insulator, a semiconductor, or a metal. Examples of the non-magnetic insulator is, for example, $Al_2O_3$, $SiO_2$, $MgO$, $MgAl_2O_4$, and materials in which a part of Al, Si, and Mg of these are replaced with Zn, Be, and the like. These materials have a large bandgap and excellent insulation. When the non-magnetic layer 20 is made of a non-magnetic insulator, the non-magnetic layer 20 is a tunnel barrier layer. Examples of the non-magnetic metal include Cu, Au, Ag, and the like. Examples of the non-magnetic semiconductor include Si, Ge, $CuInSe_2$, $CuGaSe_2$, $Cu(In, Ga)Se_2$, and the like.

The non-magnetic layer 20 may contain the above-described additive elements. If the non-magnetic layer 20 contains additive elements, it is possible to minimize the leakage magnetic field from the ferromagnetic layer 30. If the additive elements contained in the non-magnetic layer 20 exhibit diamagnetism, a small intensity of the leakage magnetic field reaching the magnetic recording layer 10 is provided.

A thickness of the non-magnetic layer 20 is preferably 20 Å or more, and more preferably 25 Å. If a large thickness of the non-magnetic layer 20 is provided, a resistance area product (RA) of the magnetic domain wall moving element 100 increases. The resistance area product (RA) of the magnetic domain wall moving element 100 is preferably $1 \times 10^4$ $\Omega \mu m^2$ or more, and more preferably $5 \times 10^4$ $\Omega \mu m^2$ or more. The resistance area product (RA) of the magnetic domain wall moving element 100 is represented by a product of an element resistance of one of the magnetic domain wall moving elements 100 and an element cross-sectional area of the magnetic domain wall moving element 100 (an area of a cut surface obtained by cutting the non-magnetic layer 20 in the xy plane).

The magnetic domain wall moving element 100 may have a layer other than the magnetic recording layer 10, the non-magnetic layer 20, and the ferromagnetic layer 30. For example, the layer may be provided on a surface of the ferromagnetic layer 30 opposite to the non-magnetic layer 20 to have a spacer layer arranged between the layer and the ferromagnetic layer 30. When the ferromagnetic layer 30, the spacer layer, and an antiferromagnetic layer are provided to have a synthetic antiferromagnetic structure (an SAF structure), the coercive force of the ferromagnetic layer 30 increases. Furthermore, an underlayer may be provided on a lower surface of the magnetic recording layer 10 and a cap layer may be provided on an upper surface of the ferromagnetic layer 30.

The first conductive layer 41 and the second conductive layer 42 are connected to the magnetic recording layer 10. The first conductive layer 41 and the second conductive layer 42 may be connected to the same surface of the magnetic recording layer 10 or may be connected to different surfaces. The second conductive layer 42 is located apart from the first conductive layer 41 and connected to the magnetic recording layer 10. The first conductive layer 41 is connected to, for example, a first end part of the magnetic recording layer 10 and the second conductive layer 42 is connected to, for example, a second end part of the magnetic recording layer 10. The first conductive layer 41 and the second conductive layer 42 are, for example, connecting parts between the via line V and the magnetic recording layer 10.

The first conductive layer 41 and the second conductive layer 42 contains, for example, magnetic materials. A magnetization $M_{41}$ of the first conductive layer 41 and a magnetization $M_{42}$ of the second conductive layer 42 are oriented in one direction. The magnetization $M_{41}$ is oriented, for example, in the +z direction. The magnetization $M_{42}$ is oriented, for example, in the −z direction. The magnetization $M_{41}$ of the first conductive layer 41 and the magnetization $M_{11}$ of the magnetization fixing region 11 are oriented, for example, in the same direction. The magnetization $M_{42}$ of the second conductive layer 42 and the magnetization $M_{12}$ of the magnetization fixing region 12 are oriented, for example, in the same direction. The first conductive layer 41 is fixed to the magnetization $M_{11}$ of the magnetization fixing region 11. The second conductive layer 42 is fixed to the magnetization $M_{12}$ of the magnetization fixing region 12.

Examples of the first conductive layer 41 and the second conductive layer 42 include a metal selected from the group consisting of Cr, Mn, Co, Fe, and Ni, an alloy containing one or more of these metals, and an alloy containing these metals and at least one or more elements of B, C, and N. Examples of the first conductive layer 41 and the second conductive layer 42 include Co—Fe, Co—Fe—B, Ni—Fe, and the like. Furthermore, the first conductive layer 41 and the second conductive layer 42 may have a synthetic antiferromagnetic structure (an SAF structure).

The first conductive layer 41 and the second conductive layer 42 may be conductive and may not be made of a magnetic material. A current density of a write current flowing through the magnetic recording layer 10 sharply decreases at a position in which the magnetic recording layer 10, the first conductive layer 41, and the second conductive layer 42 overlap. For this reason, even when the first conductive layer 41 and the second conductive layer 42 are not made of a ferromagnetic material, it is possible to prevent the domain wall DW from entering the magnetization fixing regions 11 and 12.

The insulating layers 51 and 52 are a part of the insulating layer In. The insulating layer 51 is located below the magnetic recording layer 10. A part of the insulating layer 51 is located between the first conductive layer 41 and the second conductive layer 42. The insulating layer 52 surrounds lateral sides of the non-magnetic layer 20 and the ferromagnetic layer 30. The insulating layer 52 is located above the magnetic recording layer 10.

The insulating layers 51 and 52 are a part of the insulating layer In and are made of the same material as the insulating layer In. The insulating layer 52 may have additive elements. The leakage magnetic field from the ferromagnetic layer 30 occurs from, for example, the first surface 30A of the ferromagnetic layer 30, goes around a lateral side of the ferromagnetic layer 30, and recirculates to a second surface 30B of the ferromagnetic layer 30. If the insulating layer 52 has the additive elements, it is possible to inhibit the recirculating magnetic field and minimize the leakage magnetic field from the ferromagnetic layer 30.

The direction of magnetization of each layer of the magnetic domain wall moving element 100 can be confirmed, for example, by measuring a magnetization curve. The magnetization curve can be measured using, for example, a magneto optical Kerr effect (MOKE). The measurement using the MOKE is a measurement method in which linearly polarized light is caused to be incident on an object to be measured and which is performed using a magneto-optical effect (a magnetic Kerr effect) in which rotation or the like in a polarization direction thereof occurs.

A method for manufacturing the magnetic array 200 will be described below. The magnetic array 200 is formed using a laminating step of each layer and a processing step of processing a part of each layer to have a prescribed shape. For the lamination of each layer, a sputtering method, a chemical vapor deposition (CVD) method, an electron beam vapor deposition method (EB vapor deposition method), an atomic laser deposit method, or the like can be utilized. The processing of each layer can be performed using photolithography or the like.

First, the source region S and the drain region D are formed by doping a prescribed position of the substrate Sub with impurities. Subsequently, the gate insulating film GI and the gate electrode G are formed between the source region S and the drain region D. The source region S, the drain region D, the gate insulating film GI, and the gate electrode G serve as the transistor Tr.

Subsequently, the insulating layer In is formed to cover the transistor Tr. Furthermore, the via line V is formed by forming an opening portion in the insulating layer In and filling the opening portion with a conductor. The write lines WL, the common lines CL, and the read lines RL are formed by laminating the insulating layer In to have a prescribed thickness, forming a groove in the insulating layer In, and then filling the groove with a conductor.

For example, the first conductive layer 41 and the second conductive layer 42 can be formed by laminating the ferromagnetic layer on the insulating layer In and one surface of the via line V and removing parts other than the parts which are the first conductive layer 41 and the second conductive layer 42. The removed parts are embedded, for example, with the insulating layer In (the insulating layer 51).

Subsequently, the magnetic recording layer 10, the non-magnetic layer 20, and the ferromagnetic layer 30 are laminated in this order above the first conductive layer 41, the second conductive layer 42, and the insulating layer 51. After that, the magnetic domain wall moving element 100 is obtained by processing the non-magnetic layer 20 and the ferromagnetic layer 30 to have a prescribed shape.

The additive elements are added, for example, when a film of the ferromagnetic layer 30 is formed. Since sufficient additive elements are not contained in an alloy only by forming a film in an atmosphere containing the additive elements, an addition treatment is performed.

As the addition treatment, for example, a film of the ferromagnetic layer 30 is formed by repeated performing the formation and etching of the magnetic film. The magnetic film is formed in units of several Å in an atmosphere in which additive elements are contained. The magnetic film is etched using reverse sputtering in an atmosphere in which additive elements are contained. More additive elements are incorporated into the ferromagnetic layer 30 by repeatedly performing the film formation and etching the magnetic film. Furthermore, the contents of the additive elements contained in the ferromagnetic layer 30 can be adjusted by adjusting the balance between a film thickness to be etched and a film thickness.

Also, it is desirable that a gas pressure of a gas containing an additive element when a film of the ferromagnetic layer 30 is formed be higher than a gas pressure when the magnetic recording layer 10 is laminated. Furthermore, it is desirable that an application voltage applied to a sputtering target when a film of the ferromagnetic layer 30 is formed be also higher than that when the magnetic recording layer 10 is laminated. Furthermore, when a gas containing one or more of a H element, a N element, and a C element is mixed in a gas atmosphere at the time of film formation or etching, a diamagnetic material is more easily incorporated into the ferromagnetic layer 30.

Furthermore, when the additive elements are C, Ag, Cu, Hg, Au, Pb, Zn, and Bi, as the addition treatment, for example, a film formation of a magnetic film and a film formation of at least one or more materials of C, Ag, Cu, Hg, Au, Pb, Zn, and Bi are repeatedly performed. The formed film is formed in units of several A. The contents of the additive elements in the ferromagnetic layer 30 can be adjusted by adjusting the balance of each film thickness. When the non-magnetic layer 20 and the insulating layer 52 contain additive elements, the same treatment is performed on these layers at the time of film formation.

According to the magnetic domain wall moving element 100 associated with the first embodiment, it is possible to minimize the leakage magnetic field from the ferromagnetic layer 30 reaching the magnetic recording layer 10. The leakage magnetic field from the ferromagnetic layer 30 is an external magnetic field with respect to the magnetic recording layer 10. If an external magnetic field is applied to the magnetic recording layer 10, the domain wall DW may disappear unexpectedly or the domain wall DW may be generated in an unexpected place in some cases. The magnetic domain wall moving element 100 records data using a change in resistance value of the magnetic domain wall moving element 100 accompanied by a change in position of the domain wall DW. A decrease in stability of a position of the domain wall DW is one of the factors for a decrease in reliability of the magnetic domain wall moving element 100.

The additive elements contained in the ferromagnetic layer 30 exhibits diamagnetism. The diamagnetism is a phenomenon in which magnetization occurs in a direction opposite to a direction in which a magnetic field occurs and the additive elements exhibiting diamagnetism creates magnetization in a direction in which a leakage magnetic field is canceled. As a result, it is possible to reduce the leakage magnetic field reaching the magnetic recording layer 10 by canceling a part of the leakage magnetic field using the additive elements exhibiting diamagnetism.

Although an example of the magnetic array 200 and the magnetic domain wall moving element 100 according to the first embodiment has been described in detail, the magnetic array 200 and the magnetic domain wall moving element 100 according to the first embodiment can be variously modified and changed within the scope of the gist of the present invention.

Figure 7:
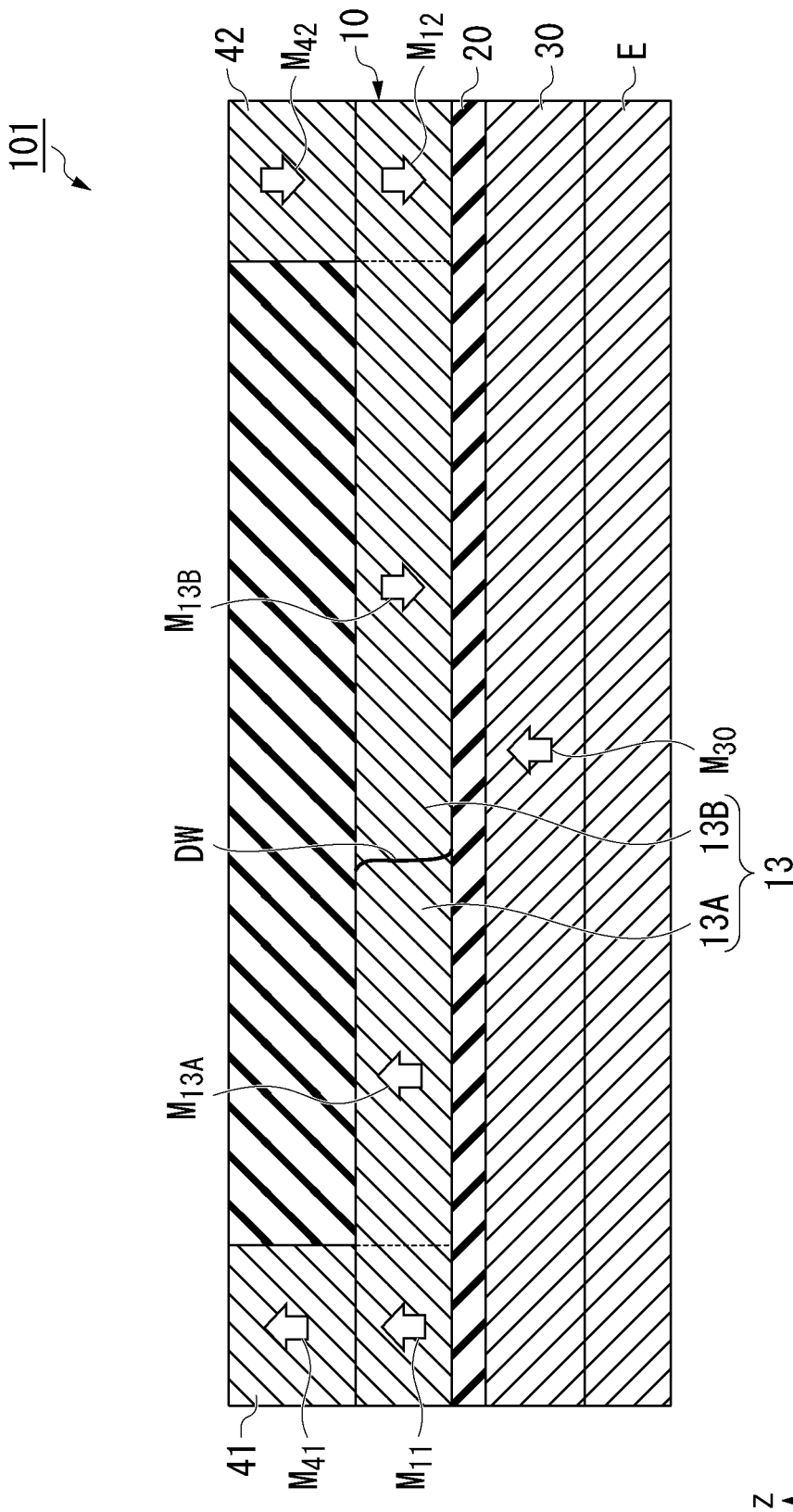
FIG. 7 is a cross-sectional view of a magnetic domain wall moving element according to a first modified example.

FIG. 7 is a cross-sectional view of a magnetic domain wall moving element 101 according to a first modified example. In the magnetic domain wall moving element 101 illustrated in FIG. 7, a ferromagnetic layer 30 is located closer to a substrate Sub than a magnetic recording layer 10. Such a magnetic domain wall moving element 101 is referred to as a "bottom pin structure". When the magnetic domain wall moving element 101 has the bottom pin structure, the same effect as the magnetic domain wall moving element 100 according to the first embodiment can be obtained.

Figure 8:
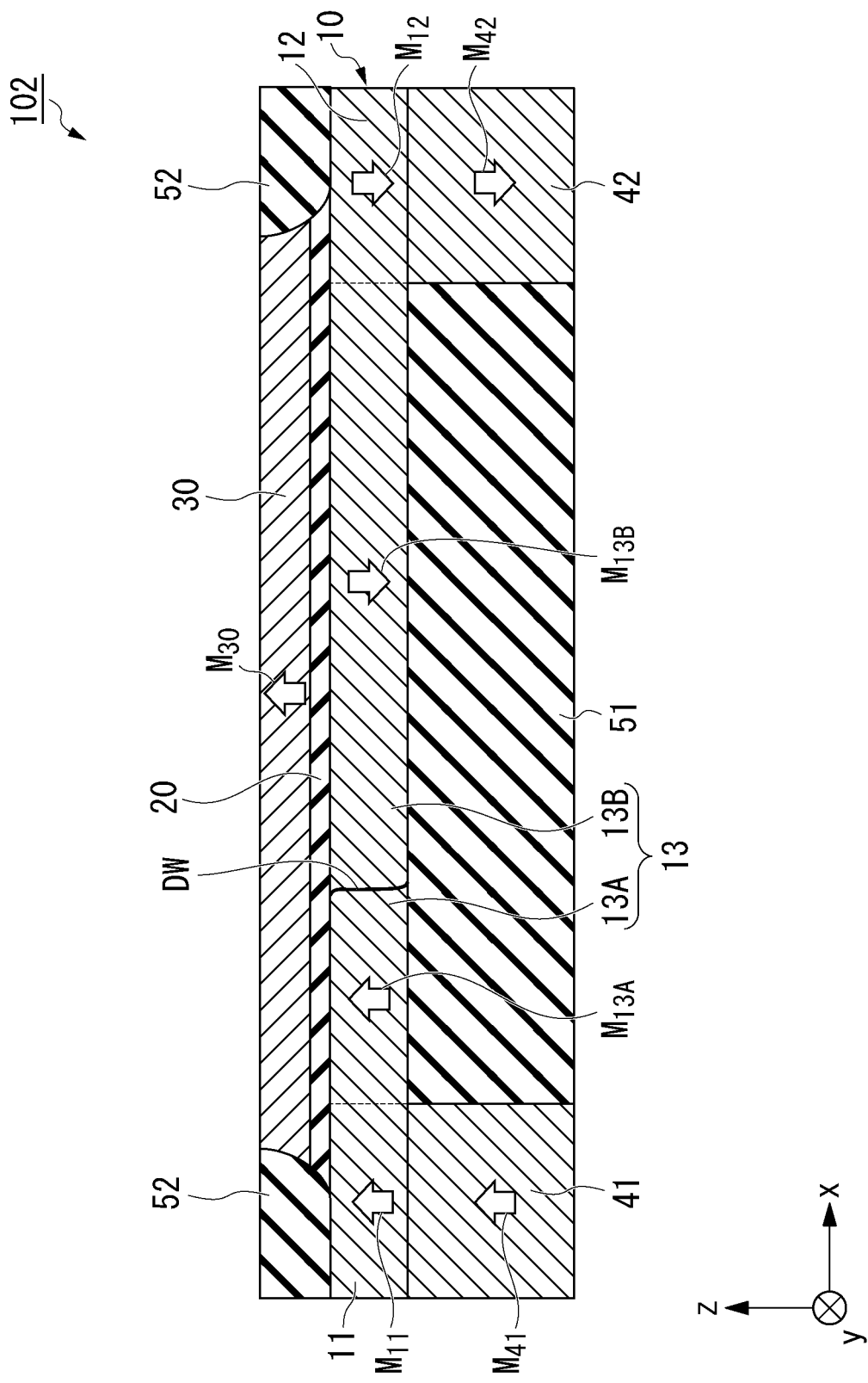
FIG. 8 is a cross-sectional view of a magnetic domain wall moving element according to a second modified example.

FIG. 8 is a cross-sectional view of a magnetic domain wall moving element 102 according to a second modified example. The magnetic domain wall moving element 102 illustrated in FIG. 8 extends to a position in which a ferromagnetic layer 30, a first conductive layer 41, and a second conductive layer 42 overlap in the z direction. The movement of a domain wall DW in the entire region of a domain wall moving region 13 affects a change in resistance of the magnetic domain wall moving element 102 in the z direction and can increase a change width in resistance of the magnetic domain wall moving element 102. Furthermore, the magnetic domain wall moving element 102 according to the second modified example has the same effect as the magnetic domain wall moving element 100 according to the first embodiment.

Figure 9:
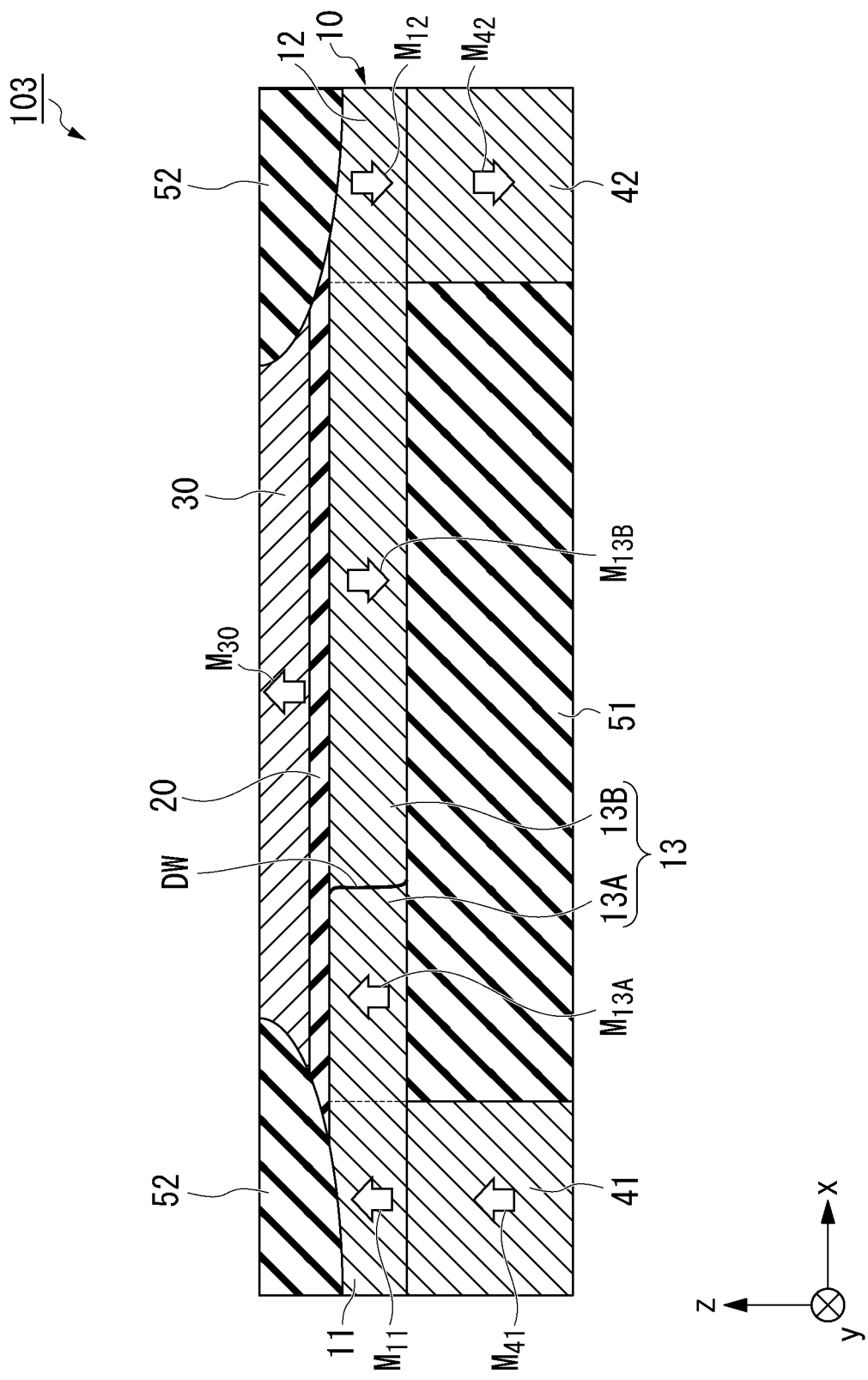
FIG. 9 is a cross-sectional view of a magnetic domain wall moving element according to a third modified example.

FIG. 9 is a cross-sectional view of a magnetic domain wall moving element 103 according to a third modified example. The magnetic domain wall moving element 103 illustrated in FIG. 9 is different from that of FIG. 4 in that upper surfaces of magnetization fixing regions 11 and 12 are etched. When the processes of a magnetic recording layer 10, a non-magnetic layer 20, and a ferromagnetic layer 30 are performed at the same time, a manufacturing process is simplified. The magnetic domain wall moving element 103 can have the same effect as the magnetic domain wall moving element 100 according to the first embodiment.

The preferred embodiments of the present invention have been described in detail above. The characteristic constitution in the embodiments and modifications may be combined.

EXPLANATION OF REFERENCES

10 Magnetic recording layer
11, 12 Magnetization fixing region
13 Domain wall moving region
13A First magnetic domain
13B Second magnetic domain
20 Non-magnetic layer
30 Ferromagnetic layer
30A First surface
30B Second surface
31 First region
32 Second region
33 Central region
34 Outer circumferential region
41 First conductive layer
42 Second conductive layer
51, 52, In Insulating layer
100, 101 Magnetic domain wall moving element
200 Magnetic array
CL Common line
DW Domain wall
RL Read line
Sub Substrate
WL Write line

What is claimed is:

1. A magnetic domain wall moving element, comprising:
a magnetic recording layer, a ferromagnetic layer, and a non-magnetic layer arranged between the magnetic recording layer and the ferromagnetic layer,
wherein the ferromagnetic layer contains an additive element dispersed therein,
the additive element is one or more of H, He, Ne, Ar, Kr, Xe, N, C, Ag, Cu, Hg, Au, Pb, Zn, and Bi, and
the magnetic recording layer has a domain wall, while the ferromagnetic layer does not have a domain wall.

2. The magnetic domain wall moving element according to claim 1, wherein a content concentration of the additive element of a first region is lower than that of a second region, and
the second region is farther away from the non-magnetic layer than the first region.

3. The magnetic domain wall moving element according to claim 1, wherein a content concentration of the additive element of a first region is higher than that of a second region, and
the second region is father away from the non-magnetic layer than the first region.

4. The magnetic domain wall moving element according to claim 3, wherein a content concentration of the additive element of an outer circumferential region is higher than that of a central region, and
the outer circumferential region is located further outward than the central region in an in-plane direction orthogonal to a lamination direction.

5. The magnetic domain wall moving element according to claim 1, wherein a content concentration of the additive element of an outer circumferential region is higher than that of a central region, and
the outer circumferential region is located further outward than the central region in an in-plane direction orthogonal to a lamination direction.

6. The magnetic domain wall moving element according to claim 1, wherein the non-magnetic layer contains the additive element.

7. The magnetic domain wall moving element according to claim 1, further comprising:
an insulating layer configured to surround lateral sides of the non-magnetic layer and the ferromagnetic layer,
wherein the insulating layer contains the additive element.

8. A magnetic array, comprising:
a plurality of the magnetic domain wall moving elements according to claim 1.

9. The magnetic domain wall moving element according to claim 1,
wherein the additive element is dispersed throughout an entire in-plane of the ferromagnetic layer.

* * * * *